United States Patent
Nickel et al.

(10) Patent No.: US 9,084,124 B2
(45) Date of Patent: Jul. 14, 2015

(54) METHODS AND APPARATUS FOR PERFORMING PASSIVE ANTENNA TESTING WITH ACTIVE ANTENNA TUNING DEVICE CONTROL

(71) Applicant: Apple Inc., Cupertino, CA (US)

(72) Inventors: Joshua G. Nickel, San Jose, CA (US); Jr-Yi Shen, Sunnyvale, CA (US); Anand Lakshmanan, Sunnyvale, CA (US); Jayesh Nath, Milpitas, CA (US); Matthew A. Mow, Los Altos, CA (US); Mattia Pascolini, Campbell, CA (US); Vishwanath Venkataraman, Pleasanton, CA (US); Peter Bevelacqua, San Jose, CA (US); Xin Cui, San Ramon, CA (US)

(73) Assignee: Apple Inc., Cupertino, CA (US)

( * ) Notice: Subject to any disclaimer, the term of this patent is extended or adjusted under 35 U.S.C. 154(b) by 214 days.

(21) Appl. No.: 13/725,769

(22) Filed: Dec. 21, 2012

(65) Prior Publication Data

US 2014/0179239 A1  Jun. 26, 2014

(51) Int. Cl.
*H04B 1/04* (2006.01)
*H04W 24/00* (2009.01)
(Continued)

(52) U.S. Cl.
CPC ............ *H04W 24/00* (2013.01); *G01R 31/2822* (2013.01); *H04B 17/12* (2015.01); *G01R 27/26* (2013.01); *G01R 27/28* (2013.01); *G01R 29/08* (2013.01); *G01R 29/10* (2013.01)

(58) Field of Classification Search
CPC ...... G01R 27/26; G01R 27/257; G01R 27/28; G01R 29/08; G01R 29/10; G01R 29/105

USPC ............ 455/67.11, 67.14, 115.1, 115.2, 120, 455/121, 123
See application file for complete search history.

(56) References Cited

U.S. PATENT DOCUMENTS

| 5,604,507 | A | * | 2/1997 | Openlander | .................. 343/860 |
| 6,081,700 | A | | 6/2000 | Salvi et al. | |

(Continued)

FOREIGN PATENT DOCUMENTS

CN  101262683  5/2011

OTHER PUBLICATIONS

Mow et al., U.S. Appl. No. 13/415,195, filed Mar. 8, 2012.
(Continued)

*Primary Examiner* — Duc M Nguyen
(74) *Attorney, Agent, or Firm* — Treyz Law Group; Jason Tsai; Joseph F. Guihan

(57) ABSTRACT

A wireless electronic device may contain at least one adjustable antenna tuning element for use in tuning the operating frequency range of the device. The antenna tuning element may include radio-frequency switches, continuously/semi-continuously adjustable components such as tunable resistors, inductors, and capacitors, and other load circuits that provide desired impedance characteristics. A test system that is used for performing passive radio-frequency (RF) testing on antenna tuning elements in partially assembled devices is provided. The test system may include an RF tester and a test host. The tester may be used to gather scattering parameter measurements from the antenna tuning element. The test host may be used to ensure that power and appropriate control signals are being supplied to the antenna tuning element so that the antenna tuning element is placed in desired tuning states during testing.

11 Claims, 11 Drawing Sheets

(51) Int. Cl.
  *G01R 31/28* (2006.01)
  *H04B 17/12* (2015.01)
  *G01R 27/26* (2006.01)
  *G01R 29/08* (2006.01)
  *G01R 27/28* (2006.01)
  *G01R 29/10* (2006.01)

(56) References Cited

U.S. PATENT DOCUMENTS

| | | | |
|---|---|---|---|
| 6,643,597 B1 * | 11/2003 | Dunsmore | 702/104 |
| 7,170,297 B1 * | 1/2007 | Dunsmore | 324/534 |
| 7,180,467 B2 * | 2/2007 | Fabrega-Sanchez et al. | 343/861 |
| 7,336,230 B2 * | 2/2008 | Lee et al. | 343/703 |
| 7,573,272 B2 | 8/2009 | Becker et al. | |
| 8,061,621 B2 | 11/2011 | Mio et al. | |
| 8,095,085 B2 * | 1/2012 | Song et al. | 455/107 |
| 8,588,763 B2 * | 11/2013 | Venkataraman | 455/423 |
| 8,912,809 B2 * | 12/2014 | Han et al. | 324/750.02 |
| 8,947,113 B2 * | 2/2015 | Han et al. | 324/750.02 |
| 2004/0153265 A1 * | 8/2004 | Martens et al. | 702/65 |
| 2007/0126427 A1 * | 6/2007 | Lee et al. | 324/500 |
| 2009/0046030 A1 * | 2/2009 | Song et al. | 343/852 |
| 2009/0298440 A1 * | 12/2009 | Takeya et al. | 455/67.14 |
| 2011/0270561 A1 * | 11/2011 | Gregg et al. | 702/82 |
| 2012/0161784 A1 * | 6/2012 | Benedikt | 324/612 |
| 2013/0122827 A1 | 5/2013 | Ali et al. | |
| 2014/0302797 A1 * | 10/2014 | Han et al. | 455/67.14 |

OTHER PUBLICATIONS

Mow et al., U.S. Appl. No. 13/437,804, filed Apr. 2, 2012.
Han et al., U.S. Appl. No. 13/466,017, filed May 7, 2012.

* cited by examiner

METHODS AND APPARATUS FOR PERFORMING PASSIVE ANTENNA TESTING WITH ACTIVE ANTENNA TUNING DEVICE CONTROL

BACKGROUND

This relates generally to wireless communications circuitry, and more particularly, to electronic devices having wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry.

To satisfy consumer demand for small form factor wireless devices, manufacturers are continually striving to implement wireless communications circuitry such as antenna components using compact structures. However, it can be difficult to fit conventional antenna structures into small devices. For example, antennas that are confined to small volumes often exhibit narrower operating bandwidths than antennas that are implemented in larger volumes. If the bandwidth of an antenna becomes too narrow, the antenna will not be able to cover all communications bands of interest.

In view of these considerations, it would be desirable to provide antenna tuning elements that allow the antenna to cover a wider range of frequency bands. Antenna tuning elements are adjustable components that can be placed in various tuning states during wireless operation of an electronic device. In order for the antenna to be able to cover the desired range of frequency bands, the antenna tuning elements would have to be able to switch among the different tuning states and to provide appropriate loading in the different respective tuning states.

During device assembly, workers and automated assembly machines may be used to solder the antenna tuning elements to various antenna structures and to otherwise form connections to other wireless circuitry. If care is not taken, however, faults may result that can impact the performance of a final assembled device. For example, an antenna tuning element may not be properly mounted within the electronic device. As another example, an antenna tuning element may be damaged during assembly due to overheating, electrical stress (i.e., from excessive amounts of electrostatic discharge), and mechanical stress (i.e., from being dropped or otherwise mishandled), or may exhibit manufacturing defects that result in the antenna tuning element being unable to switch from one state to another or exhibiting unsatisfactory loading in the different states. In some situations, it can be difficult or impossible to detect and identify these defects, if at all, until assembly is complete and a finished device is available for testing. Detection of defects only after assembly is complete can result in costly device scrapping or extensive reworking.

It would therefore be desirable to be able to provide improved ways in which to characterize the performance and to detect faults associated with antenna tuning elements during the manufacturing of electronic devices.

SUMMARY

A wireless electronic device may include storage and processing circuitry and wireless communications circuitry. The wireless communications circuitry may include a baseband processor, transceiver circuitry, and at least one tunable antenna. The tunable antenna may be provided with at least one adjustable antenna tuning element. The adjustable antenna tuning element may be used to help the tunable antenna cover a wider range of communications frequencies than would otherwise be possible.

The adjustable antenna tuning element may include radio-frequency switches, continuously or semi-continuously tunable resistive/inductive/capacitive components forming using integrated circuits, discrete surface mount components, or other suitable conductive structures, and other load circuits configured to provide desired impedance characteristics for the tunable antenna at selected frequencies.

In accordance with an embodiment of the present invention, a radio-frequency test system may be provided that includes a test host, a radio-frequency tester for generating radio-frequency test signals (e.g., vector network analyzer, a spectrum analyzer, etc.) and for gathering radio-frequency measurements, a test fixture on which a wireless electronic device under test (DUT) that contains an adjustable antenna tuning element may be mounted during testing, and other test equipment. The radio-frequency test system may be used to test partially assembled wireless electronic devices so that defects in the DUT can be detected at a relatively early assembly stage.

Power may be supplied to the antenna tuning element. As an example, power supply voltages may be directly supplied to the antenna tuning element from the test host. As another example, the test host may send commands to the DUT that direct a power supply circuit with the DUT to provide power supply voltages to the adjustable antenna tuning element.

While power is being supplied to the antenna tuning element, the antenna tuning element may be placed in a variety of different tuning states during testing to tune the tunable antenna. As an example, the test host may directly send control signals to the antenna tuning element to configure the antenna tuning element in the different respective tuning states. As another example, the test host may send commands that direct processing circuitry (e.g., the baseband processor) within the DUT to provide appropriate control signals to the antenna tuning element that configure the antenna tuning element in the different respective tuning states.

While the adjustable antenna tuning element is being placed in each of the different tuning states, the RF tester may be used to gather radio-frequency test data from the wireless DUT. For example, single-port or multiport scattering parameter measurements may be obtained using the RF tester by sending RF test signals to the DUT and by receiving corresponding RF test signals emitted/reflected from the DUT. The RF test signals may be applied and detected using contact test probes (e.g., pogo-pin test probes, coaxial test probes, etc.) or wireless test probes sometimes referred to as antenna probes. During passive test operations of this type, the transceiver circuitry within the DUT may be deactivated so that only radio-frequency characteristics associated with the adjustable antenna tuning element in its different tuning states are being measured.

Further features of the present invention, its nature and various advantages will be more apparent from the accompanying drawings and the following detailed description.

DETAILED DESCRIPTION

Figure 1:
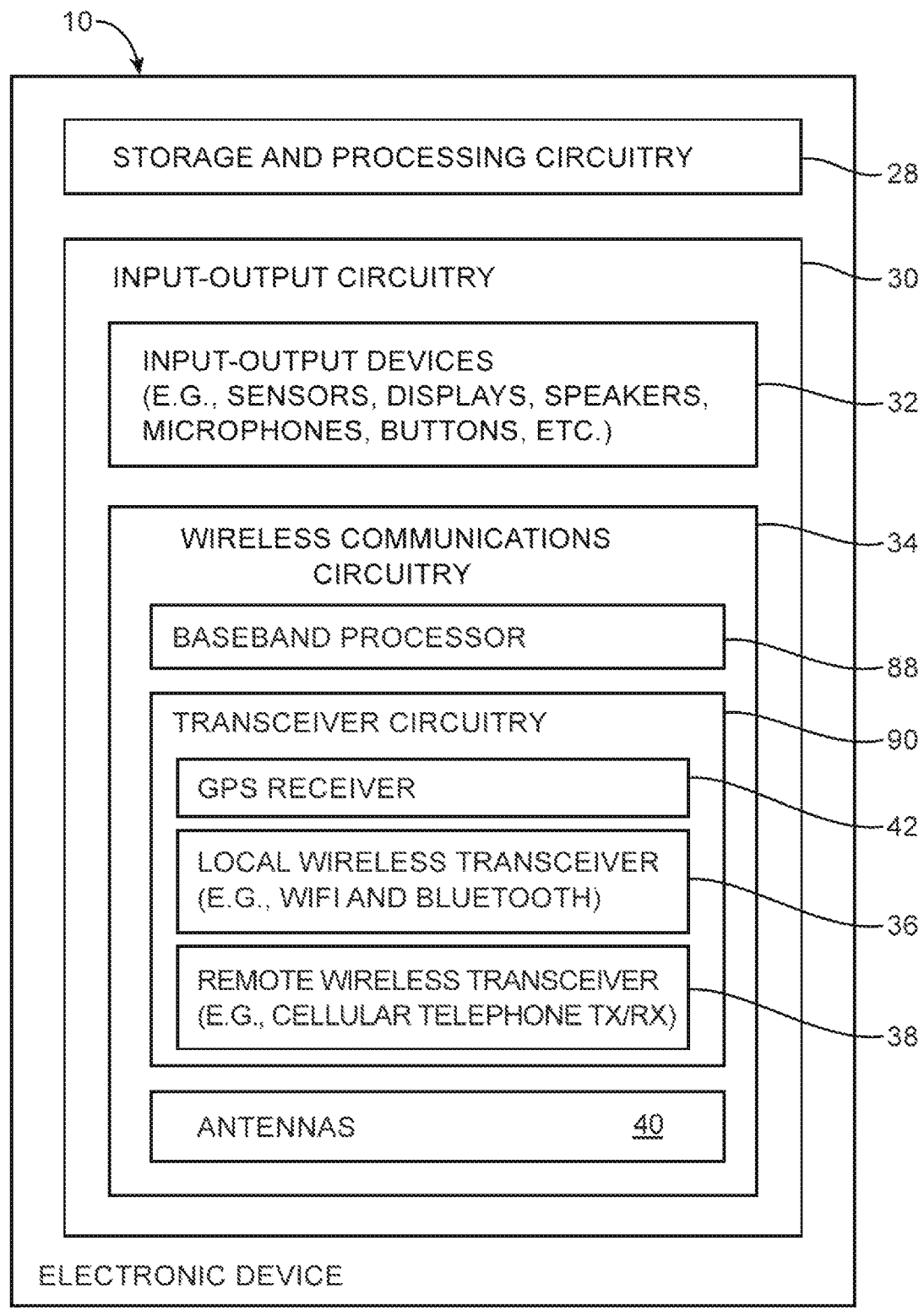
FIG. 1 is a schematic diagram of an illustrative electronic device with wireless communications circuitry in accordance with an embodiment of the present invention.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 700 MHz band, the 800 MHz band, the 850 MHz band, the 900 MHz band, the 1800 MHz band, the 1900 MHz band, the 2100 MHz band, and other bands. The long-range bands used by device 10 may include the so-called LTE (Long Term Evolution) bands. The LTE bands are numbered (e.g., 1, 2, 3, etc.) and are sometimes referred to as E-UTRA operating bands. Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to communications band selection during radio-frequency transmission and reception operations, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, and the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 90 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data traffic.

Transceiver circuitry 90 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

As shown in FIG. 1, wireless communications circuitry 34 may also include baseband processor 88. Baseband processor 88 may include memory and processing circuits and may also be considered to form part of storage and processing circuitry 28 of device 10.

Baseband processor 88 may be used to provide data to storage and processing circuitry 28. Data that is conveyed to circuitry 28 from baseband processor 88 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by storage and processing circuitry 28 and/or processor 88 and, in response, storage and processing circuitry 28 (or, if desired, baseband processor 88) may issue control commands for controlling wireless circuitry 34. For example, baseband processor 88 may issue commands that direct transceiver circuitry 90 to switch into use desired transmitters/receivers and antennas.

Antenna diversity schemes may be implemented in which multiple redundant antennas are used in handling communications for a particular band or bands of interest. In an antenna diversity scheme, storage and processing circuitry 28 may select which antenna to use in real time based on signal strength measurements or other data. In multiple-input-multiple-output (MIMO) schemes, multiple antennas may be used in transmitting and receiving multiple data streams, thereby enhancing data throughput.

Figure 2:
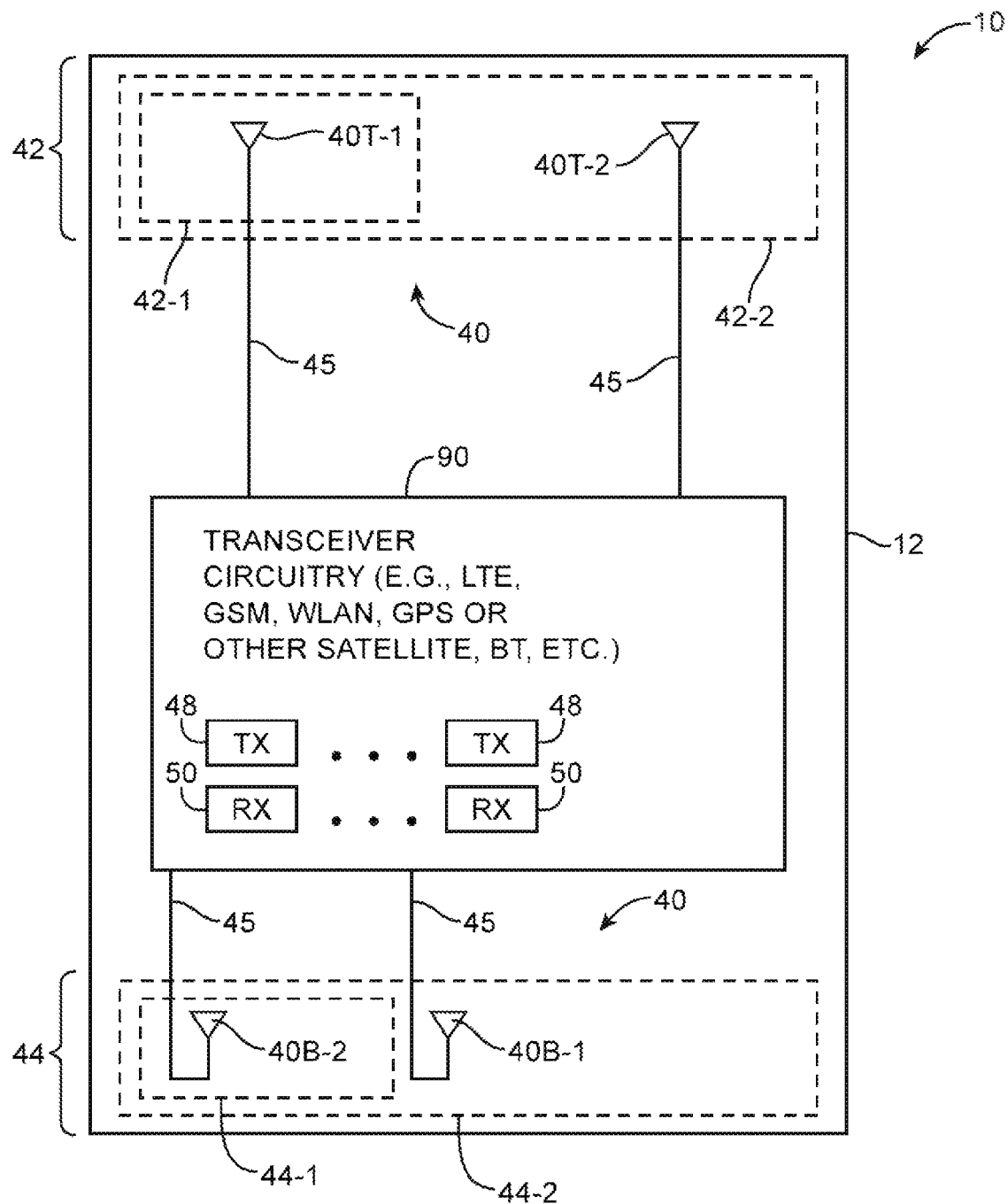
FIG. 2 is a diagram showing how radio-frequency transceiver circuitry may be coupled to one or more antennas within an electronic device of the type shown in FIG. 1 in accordance with an embodiment of the present invention.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Impedance matching circuitry, filter circuitry, and switching circuitry may be interposed in paths 45 (as examples). Impedance matching circuitry may be used to ensure that antennas 40 are efficiently coupled to transceiver circuitry 90 in desired frequency bands of interest. Filter circuitry may be used to implement frequency-based multiplexing circuits such as diplexers, duplexers, and triplexers. Switching circuitry may be used to selectively couple antennas 40 to desired ports of transceiver circuitry 90. For example, a switch may be configured to route one of paths 45 to a given antenna in one operating mode. In another operating mode, the switch may be configured to route a different one of paths 45 to the given antenna. The use of switching circuitry between transceiver circuitry 90 and antennas 40 allows device 10 to switch particular antennas 40 in and out of use depending on the current performance associated with each of the antennas.

In a device such as a cellular telephone that has an elongated rectangular outline, it may be desirable to place antennas 40 at one or both ends of the device. As shown in FIG. 2, for example, some of antennas 40 may be placed in upper end region 42 of housing 12 and some of antennas 40 may be placed in lower end region 44 of housing 12. The antenna structures in device 10 may include a single antenna in region 42, a single antenna in region 44, multiple antennas in region 42, multiple antennas in region 44, or may include one or more antennas located elsewhere in housing 12.

Antenna structures 40 may be formed within some or all of regions such as regions 42 and 44. For example, an antenna such as antenna 40T-1 may be located within region 42-1 or an antenna such as antenna 40T-2 may be formed that fills some or all of region 42-2. Similarly, an antenna such as antenna 40B-1 may fill some or all of region 44-2 or an antenna such as antenna 40B-2 may be formed in region 44-1. These types of arrangements need not be mutually exclusive. For example, region 44 may contain a first antenna such as antenna 40B-1 and a second antenna such as antenna 40B-2.

Transceiver circuitry 90 may contain transmitters such as radio-frequency transmitters 48 and receivers such as radio-frequency receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, other suitable wireless communications circuits, and combinations of these circuits).

Figure 3:
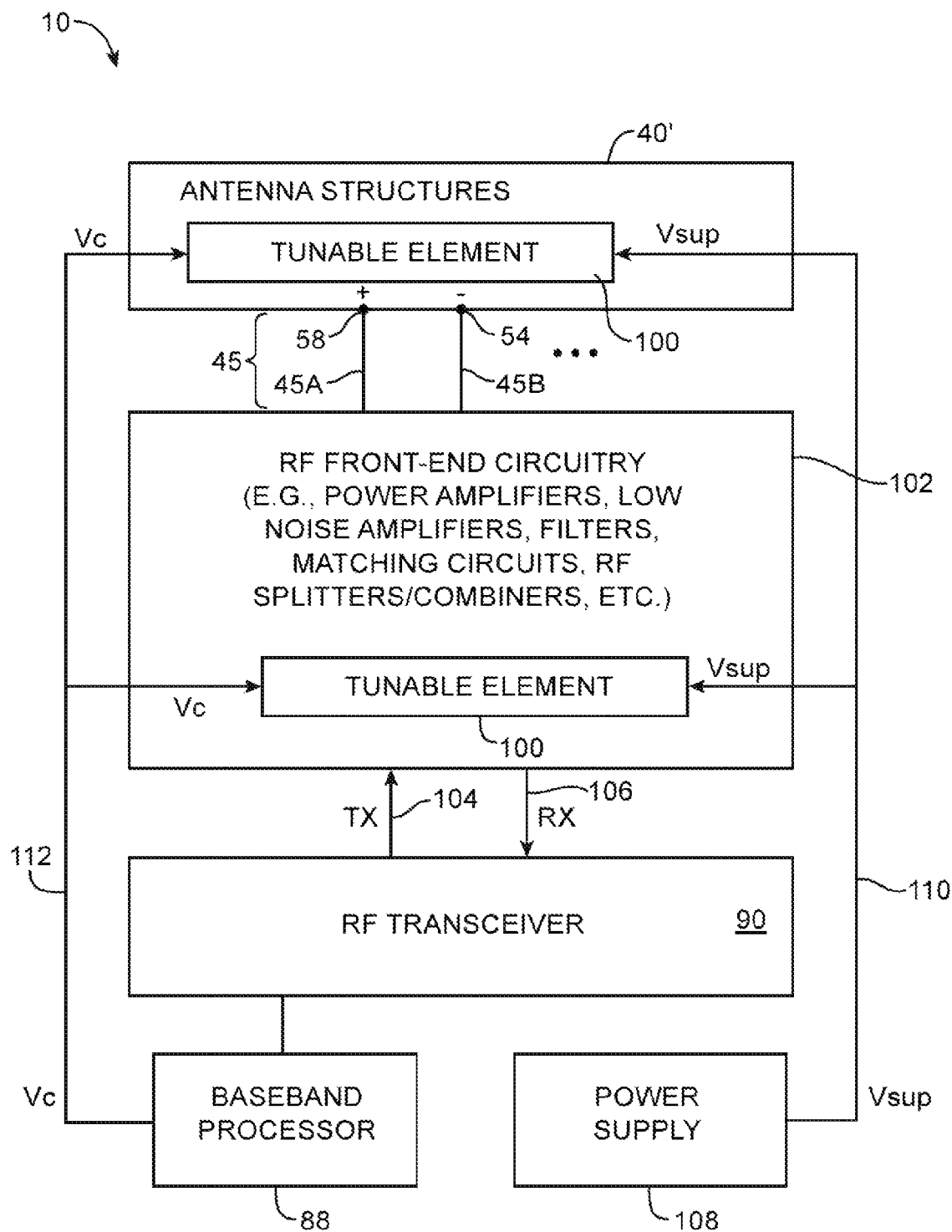
FIG. 3 is a circuit diagram showing how wireless communications circuitry in the electronic device of FIG. 1 may be provided with adjustable antenna tuning elements in accordance with an embodiment of the present invention.

FIG. 3 is a diagram showing how radio-frequency path 45 may be used to convey radio-frequency signals between radio-frequency transceiver 90 and antenna structures 40' (e.g., antenna resonating structures and associated grounding structures formed within device 10 or formed as part of housing 12 of device 10). Antenna structures 40' may be part of the antennas of FIG. 2 (e.g., antenna 40T-1, 40T-2, 40B-1, 40B-2, or other antennas).

As shown in FIG. 3, radio-frequency front-end circuitry such as front-end circuitry 102 may be interposed in the transmission line path between transceiver 90 and antenna structures 40'. Uplink signals may be provided from transceiver 90 to front-end circuitry 102 via transmit (TX) port 104, whereas downlink signals may be provided from front-end circuitry 102 to transceiver 90 via receive (RX) port 106. Radio-frequency front-end circuitry 102 may include power amplifiers for amplifying transmit radio-frequency signals, low noise amplifiers for amplifying received radio-frequency signals, filters for applying desired frequency-based selection, matching circuits for providing desired impedance between different radio-frequency components, radio-frequency splitters/combiners, etc.

Radio-frequency front-end circuitry 102 may be coupled to antenna structures 40' via conductive path 45. Conductive path 45 may include one or more transmission lines such as one or more segments of coaxial cable, one or more segments of microstrip transmission line, one or more segments of stripline transmission line, or other transmission line structures. Path 45 may include a first conductor such as signal line 45A and may include a second conductor such as ground line 45B. Antenna 40 may have an antenna feed with a positive (+) antenna feed terminal 58 that is coupled to signal path 45A and a ground (−) antenna feed terminal 54 that is coupled to ground path 45B. In practice, front-end circuitry 102 may be interposed in path 45 and may sometimes be considered as an integral part of path 45.

As described above, antenna structures 40' may be formed from loop antenna structures, patch antenna structures, inverted-F antenna structures, slot antenna structures, planar inverted-F antenna structures, helical antenna structures, hybrids of these designs, etc.

In general, it is desirable for device 10 to be able to exhibit wide band coverage (e.g., for device 10 to be able to support operation in multiple frequency bands corresponding to different radio access technologies). For example, it may be desirable for antenna 40 to be capable of operating in a higher frequency band that covers the GSM sub-bands at 1800 MHz and 1900 MHz and the data sub-band at 2100 MHz, a first lower frequency band that covers the GSM sub-bands at 850 MHz and 900 MHz, and a second lower frequency band that covers the LTE band at 700 MHz, the GSM sub-bands at 710 MHz and 750 MHz, the UMTS sub-band at 700 MHz, and other desired wireless communications bands.

The band coverage of antenna 40 may be limited by its volume (i.e., the amount of space that is occupied by antenna 40 within housing 12). For an antenna having a given volume, a higher band coverage (or bandwidth) results in a decrease in gain (e.g., the product of maximum gain and bandwidth is constant). As a result, increasing the volume of antenna 40 will generally increase its band coverage. Increasing the volume of antennas, however, may not always be feasible if a small form factor is desired.

To satisfy consumer demand for small form factor wireless devices, one or more of antennas 40 in device 10 may be provided with antenna tuning circuitry. The antenna tuning circuitry may include a tunable radio-frequency component such as tunable component (sometimes referred to as an adjustable antenna tuning element) 100. Tunable element 100 may sometimes be formed as an integral part of or as a separate discrete surface-mount component that is attached to parts of antenna structures 40' and/or RF front-end circuitry 102 (see, e.g., FIG. 3).

For example, antenna tuning element 100 may include switching circuitry based on one or more radio-frequency switches or continuously tunable load components. Antenna tuning elements 100 may include active components configured to receive power supply voltages. Device 10 may therefore include a power supply circuit such as power supply 108 that is operable to supply antenna tuning elements 100 with power supply voltage Vsup via power supply line 110 during normal operation of device 10.

Baseband processor 88 (or other control circuitry within storage and processing circuitry 28) may be used to place tunable elements 100 in their desired tuning states by sending appropriate control signals Vc via path 112. The example of FIG. 3 in which antenna tuning elements 100 receive power supply signals Vsup from power supply 108 and receive control signals Vc from baseband processor 88 is merely illustrative and does not serve to limit the scope of the present invention. If desired, antenna tuning elements 100 may receive power supply voltage signals and control signals from any suitable circuitry within device 10 during normal operation.

Antenna tuning element 100 may, for example, include a switch that can be dynamically placed in an open or closed position. When the switch is placed in its open position (e.g., when control signal Vc has a first value), antenna 40 may exhibit a first frequency response. When the switch is placed in its closed position (e.g., when control signal Vc has a second value that is different than the first value), antenna 40 may exhibit a second frequency response. By using an antenna tuning scheme of this type, a relatively narrow bandwidth (and potentially compact) design can be used for antenna 40, if desired. The use of antenna tuning circuitry may therefore help device 10 cover a wider range of communications frequencies than would otherwise be possible.

Figure 4:
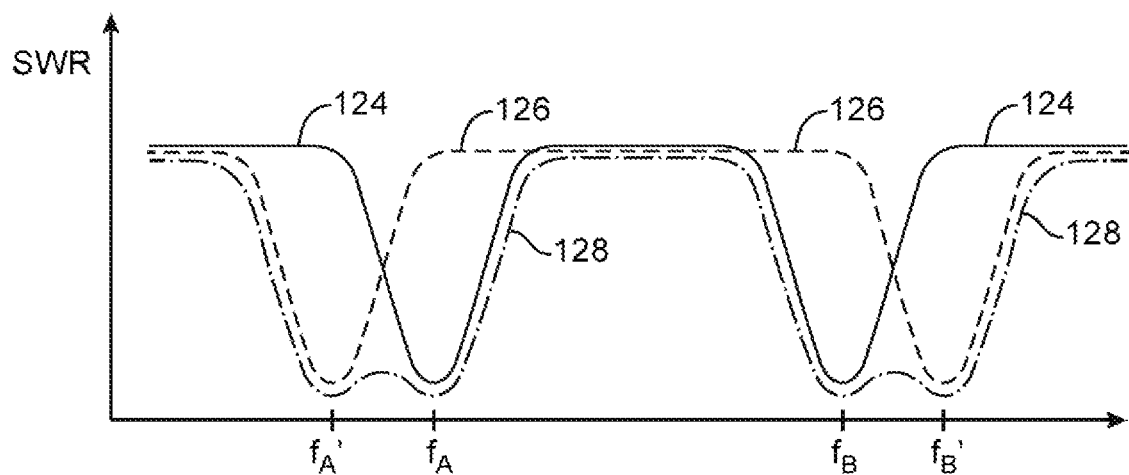
FIGS. 4 and 5 are plots showing how antennas containing tuning elements may be used to cover multiple communications bands of interest in accordance with an embodiment of the present invention.

By dynamically controlling antenna tuning elements 100, antenna 40 may be able to cover a wider range of radio-frequency communications frequencies than would otherwise be possible. A standing-wave-ratio (SWR) versus frequency plot such as SWR plot of FIG. 4 illustrates the band tuning capability for antenna 40. As shown in FIG. 4, solid SWR frequency characteristic curve 124 corresponds to a first antenna tuning mode in which antenna 40 exhibits satisfactory resonant peaks at low-band frequency $f_A$ (e.g., to cover the 850 MHz band) and high-band frequency $f_B$ (e.g., to cover the 1900 MHz band). In the first antenna tuning mode, the antenna tuning elements 100 of antenna 40 may be placed in a first configuration (e.g., antenna tuning elements 100 may be provided with a first set of control signals Vc).

Dotted SWR frequency characteristic curve 126 corresponds to a second antenna tuning mode in which the antennas of device 10 exhibits satisfactory resonant peaks at low-band frequency $f_A'$ (e.g., to cover the 750 MHz band) and high-band frequency $f_B'$ (e.g., to cover the 2100 MHz band). In the second antenna tuning mode, the antenna tuning elements 100 may be placed in a second configuration that is different than the first configuration (e.g., antenna tuning circuits 100 may be provided with a second set of control signals Vc that is different than the first set of control signals).

If desired, antenna 40 may be placed in a third antenna tuning mode in which antenna 40 exhibits satisfactory resonant peaks at both low-band frequencies $f_A'$ and $f_A$ (e.g., to cover both the 750 and 850 MHz bands) and at high-band frequencies $f_B$ and $f_B'$ (e.g., to cover both the 1900 and 2100 MHz bands), as shown by SWR characteristic curve 128. In the third antenna tuning mode, the antenna tuning elements 100 may be placed in a third configuration that is different than the first and second configurations (e.g., antenna tuning elements 100 may be provided with a third set of control signals Vc that is different than the first and second sets of control signals). A combination of tuning methods may be used so that the resonance curve 128 exhibits broader frequency ranges than curves 124 and 126.

Figure 5:
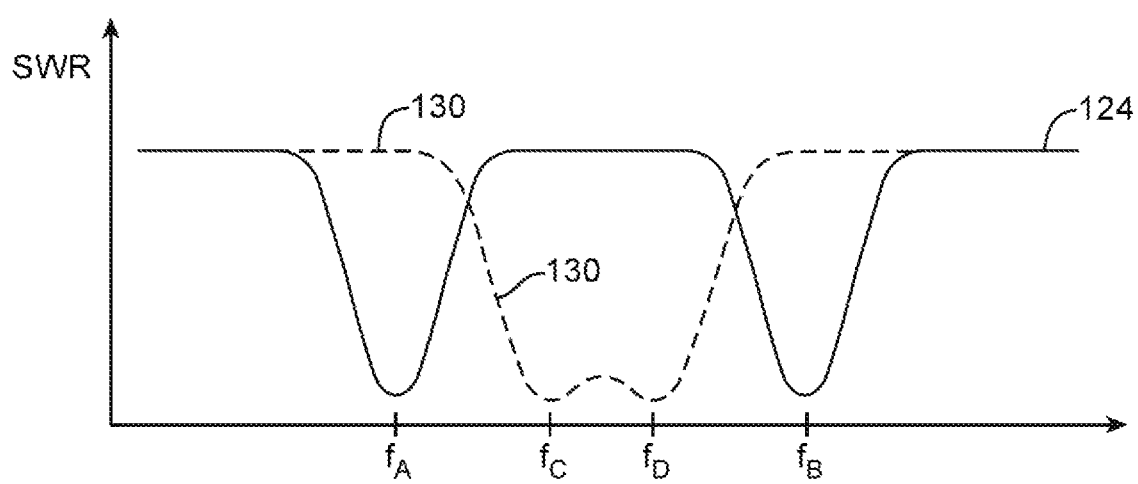

In another suitable arrangement, antenna 40 may be placed in a fourth antenna tuning mode in which antenna 40 exhibits satisfactory resonant peaks at mid-band frequencies $f_C$ and $f_D$ (e.g., to cover frequencies between the low and high bands), as shown by SWR characteristic curve 130 of FIG. 5. In the fourth antenna tuning mode, the antenna tuning circuits 100 may yet be placed in another different configuration. The SWR curves of FIGS. 4 and 5 are merely illustrative and do not serve to limit the scope of the present invention. In general, antenna(s) 40 may include antenna tuning circuits 100 that enable device 10 to transmit and receive wireless signals in any suitable number of radio-frequency communications bands.

Antenna tuning element 100 may be any switchable or tunable electrical component that can be adjusted in real time. Antenna tuning element 100 may have a first terminal A and a second terminal B that are coupled to desired locations in antenna structures 40' or RF front-end circuitry 102, a power supply terminal operable to receive Vsup from path 110 (and optionally ground power supply voltage), and a control terminal operable to receive control signal Vc from path 112.

Figure 6A:
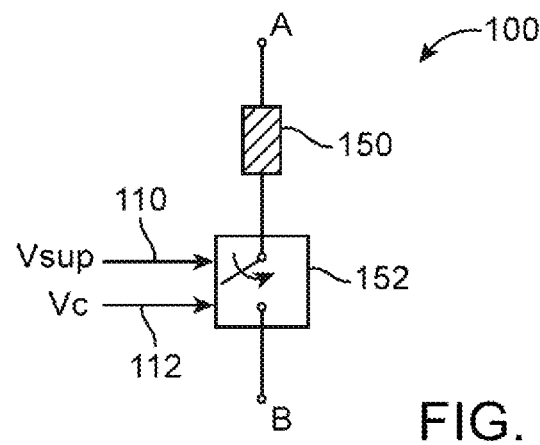
FIGS. 6A, 6B, and 6C are circuit diagrams of illustrative switchable load circuits and continuously tunable load circuits that may be used as antenna tuning elements in accordance with an embodiment of the present invention.

FIG. 6A shows one suitable circuit implementation of tunable element 100. As shown in FIG. 6A, element 100 may include a load circuit 150 and a radio-frequency switch 152 coupled in series between terminals A and B. Switch 152 may be implemented using a p-i-n diode, a gallium arsenide field-effect transistor (FET), a microelectromechanical systems (MEMS) switch, a metal-oxide-semiconductor field-effect transistor (MOSFET), a high-electron mobility transistor (HEMT), a pseudomorphic HEMT (PHEMT), a transistor formed on a silicon-on-insulator (SOI) substrate, etc. Switch 152 may be powered using Vsup provided over path 110. The state of the switch can be controlled using signal Vc provided from baseband processor 88 (see, FIG. 3). For example, a high Vc will turn on or close switch 152 whereas a low Vc will turn off or open switch 152.

Load circuit 150 may be formed from one or more electrical components. Components that may be used as all or part of circuit 150 include resistors, inductors, capacitors, and/or other electrical components. Desired resistances, inductances, and capacitances for circuit 150 may be formed using integrated circuits, using discrete components (e.g., a surface mount technology inductor) and/or using dielectric and conductive structures that are not part of a discrete component or an integrated circuit. For example, a resistance can be formed using thin lines of a resistive metal alloy, capacitance can be formed by spacing two conductive pads close to each other that are separated by a dielectric, and an inductance can be formed by creating a conductive path (e.g., a transmission line) on a printed circuit board.

Figure 6B:
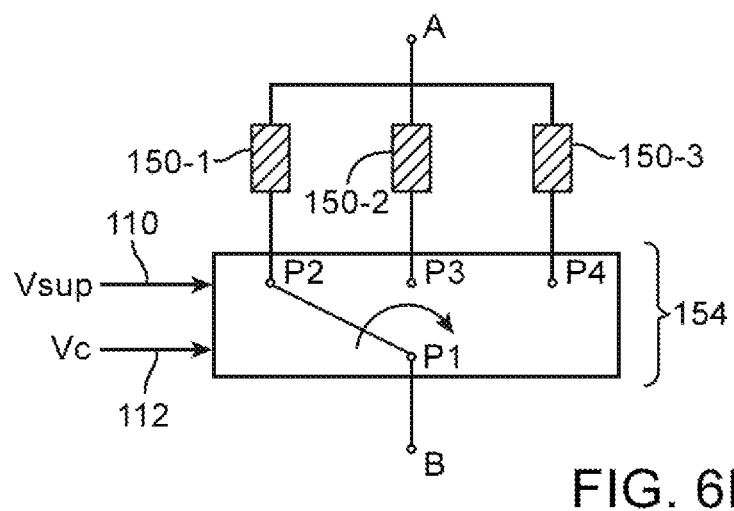

In another suitable arrangement, tunable element 100 may include a switch 154 (e.g., a single-pole triple-throw radio-frequency switch) and multiple load circuits 150-1, 150-2, and 150-3. As shown in FIG. 6B, switch 154 may have ports P1, P2, P3, and P4. Terminal B of tunable element 100 may be coupled to port P1 while terminal A of tunable element 100 may be coupled to port P2 via circuit 150-1, to port P3 via circuit 150-2, and to port P4 via circuit 150-3. As described in connection with FIG. 6A, load circuits 150-1, 150-2, and 150-3 may include any desired combination of resistive components, inductive components, and capacitive components formed using integrated circuits, discrete components, or other suitable electrical structures. Switch 154 may be powered using Vsup provide over path 110 and may be controlled using signal Vc provided over path 112. For example, switch 154 may be configured to couple port P1 to P2 when Vc is at a first value, to couple port P1 to P3 when Vc is at a second value that is different than the first value, and to couple port P1 to P4 when Vc is at a third value that is different than the first and second values.

The example of FIG. 6B in which tunable element 100 is operable in three different states is merely illustrative and does not serve to limit the scope of the present invention. If desired, tunable element 100 may include a radio-frequency switch having any number of ports configured to support switching among any desired number of loading circuits. If desired, switch 154 may be configured such that more than one of the multiple loading circuits 150 may be coupled to port P1 in parallel.

In arrangements in which tunable element 100 includes multiple capacitors 150 coupled to a single-pole multi-throw switch such as switch 154, tunable element 100 may be used to provide different capacitance values in each of its respective states and may therefore sometimes be referred to as a programmable array of capacitors (PAC). Other arrangements in which antenna tuning element 100 is configured as a programmable array of inductors (PAI), a programmable array of resistors (PAR), or other programmable circuits with different combinations of passive electrical components may also be used in device 10.

Figure 6C:
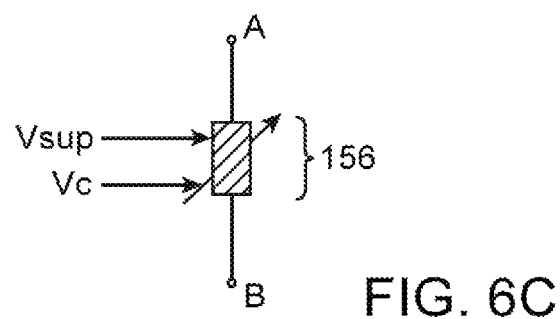

In another suitable arrangement, tunable element 100 may include a continuously tunable element such as a variable capacitor circuit 156 (sometimes referred to as a varactor). As shown in FIG. 6C, varactor 156 may have first terminal A, second terminal B, and a control terminal operable to receive signal Vsup and Vc. A continuously tunable element need not always receive power supply voltage Vsup. Control signal Vc that is provided to continuously tunable element 100 may be a digital control signal or an analog control signal that adjusts the capacitance of varactor 156 to the desired amount. Varactor 156 may be formed using integrated circuits, one or more discrete components (e.g., SMT components), etc. In general, antenna tuning element 100 may be a continuously tunable component or semi-continuously tunable component.

Having antenna tuning element 100 as part of wireless circuitry 34 introduces an additional component that needs to be tested, because the performance of antenna tuning element 100 can substantially impact the wireless operation of device 10. For example, it may be desirable to test whether tunable element 100 can switch among multiple tuning states in response to application of control signals Vc and to test whether tunable element 100 exhibits the desired impedance in each of the different states. It is generally desirable to have a way of testing the performance of antenna tuning element 100 during manufacturing prior to complete assembly of a finished device, because detection of defects only after assembly is complete can result in costly device scrapping or extensive reworking.

Figure 7:
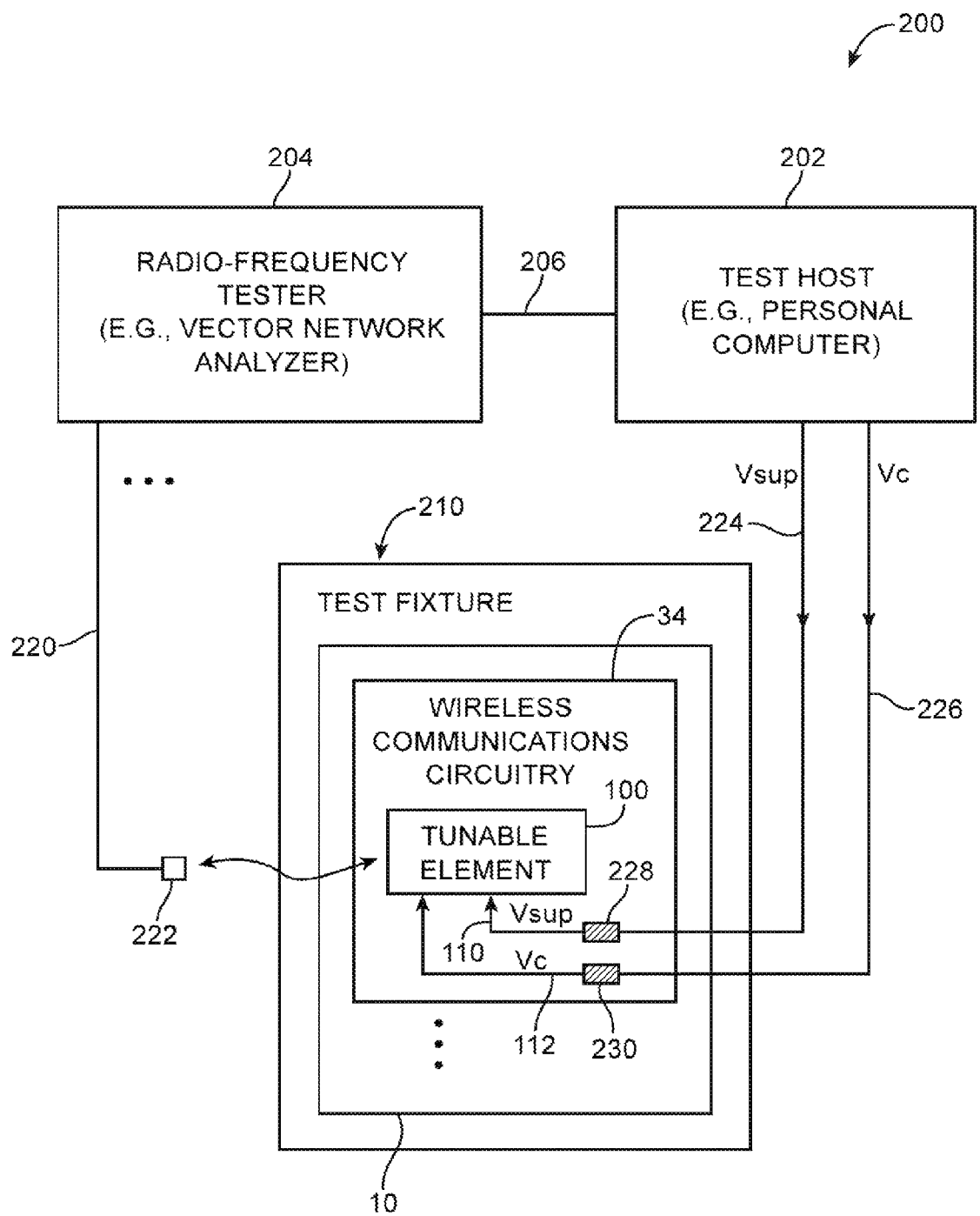
FIGS. 7 and 8 are diagrams of illustrative radio-frequency test systems for characterizing an antenna tuning element in accordance with an embodiment of the present invention.

FIG. 7 is a diagram of a test system 200 that can be used to test antenna tuning element(s) 100 in a completed or partially assembled electronic device 10. In a completed device, a display layer such as a display cover layer may be mounted to device housing 12. In a partially assembled device, the display cover layer may not yet be assembled and at least parts of wireless communications circuitry 34 may be exposed to test equipment during production testing.

An electronic device (whether completely assembled or partially assembled) that is being tested using test system 200 may sometimes be referred to as a device under test (DUT) or as device structures under test. As shown in FIG. 7, test system 200 may include a test host such as test host 202 (e.g., a personal computer), a radio-frequency tester such as radio-frequency tester 204, a test fixture such as test fixture 210, control circuitry, network circuitry, cabling, and other test equipment.

DUT 100 may be mounted on test fixture 210 during testing. Test fixture 210 may be formed from plastic support structures, a rigid printed circuit board substrate such as a fiberglass-filled epoxy substrate (e.g., FR4), a flexible printed circuit ("flex circuit") formed from a sheet of polyimide or other flexible polymer, or other dielectric material.

In the example of FIG. 7, antenna tuning element 100 may receive power supply voltage Vsup and control signal Vc from test host 202. In particular, antenna tuning element 100 may be coupled to test contacts 228 and 230 via paths 110 and 112, respectively. Test host 202 may supply signal Vsup to test contact 228 via path 224 and signals Vc to test contact 230 via path 226. When contacts 228 and 230 are mated to test host 202 via paths 224 and 226, signals provided from baseband processor 88 (if any) may be bypassed (see, FIG. 3).

Connected in this way, test host 202 may be used to directly power antenna tuning element(s) 100 on device 10 and may be used to place antenna tuning element(s) 100 in desired tuning states during testing. In particular, the control signals conveyed over path 226 may serve to place antenna tuning element 100 in the desired state for testing. For example, consider a scenario in which antenna tuning element 100 is a programmable array of capacitors of the type shown in FIG. 6B. During a first test iteration, test host 202 may send control signals to antenna tuning element 100 via path 226 that configure switch 154 to connect ports P1 and P2. During a second test iteration, test host 202 may send control signals to antenna tuning element 100 via path 226 that configure switch 154 to connect ports P1 and P3. During a third test iteration, test host 202 may send control signals to DUT 100 via path 226 that configure switch 154 to connect ports P1 and P4.

Radio-frequency tester 204 may be a vector network analyzer (as an example). Tester 204 may have at least one test port to which a test cable 220 is connected. Radio-frequency cable 220 may, for example, be a coaxial cable. In particular, cable 220 may have a first end that is connected to the tester port and a second end terminating at a radio-frequency test probe 222. During testing, test probe 222 may be coupled to antenna tuning element 100 via a wired path or a wireless path. If desired, tester 204 include multiple ports (e.g., at least two test ports, at least three test ports, at least four test ports, etc.) through which radio-frequency test signals may be transmitted to DUT 10 during testing. Radio-frequency tester 204 may receive commands from test host 202 via path 206 that direct tester 204 to gather desired radio-frequency measurements. If desired, test data can be provided from tester 204 to test host 202 via path 206.

Radio-frequency tester 204 may be configured to produce radio-frequency test signals that are applied to antenna tuning element 100 via cables 220. Radio-frequency transceiver 90 need not be active during testing of antenna tuning element 100. Even without receiving active radio-frequency signals from transceiver 90, antenna tuning element 100 may emit radio-frequency signals when being energized by the test signals generated using tester 204. As electromagnetic test signals are transmitted by tester 204 and applied to antenna tuning element 100 through test cable 220, corresponding reflected electromagnetic test signals may be received through test cable 220. The reflected signals gathered in this way may be used to compute a reflection coefficient (sometimes referred to as an S11 parameter or S11 scattering parameter). The S11 may include magnitude and phase components. Radio-frequency testing using this approach in which radio-frequency transceiver 90 is idle and is not transmitting or receiving wireless signals via antenna(s) 40 may be referred to as "passive" testing, passive radio-frequency testing, or passive antenna testing.

Figure 8:
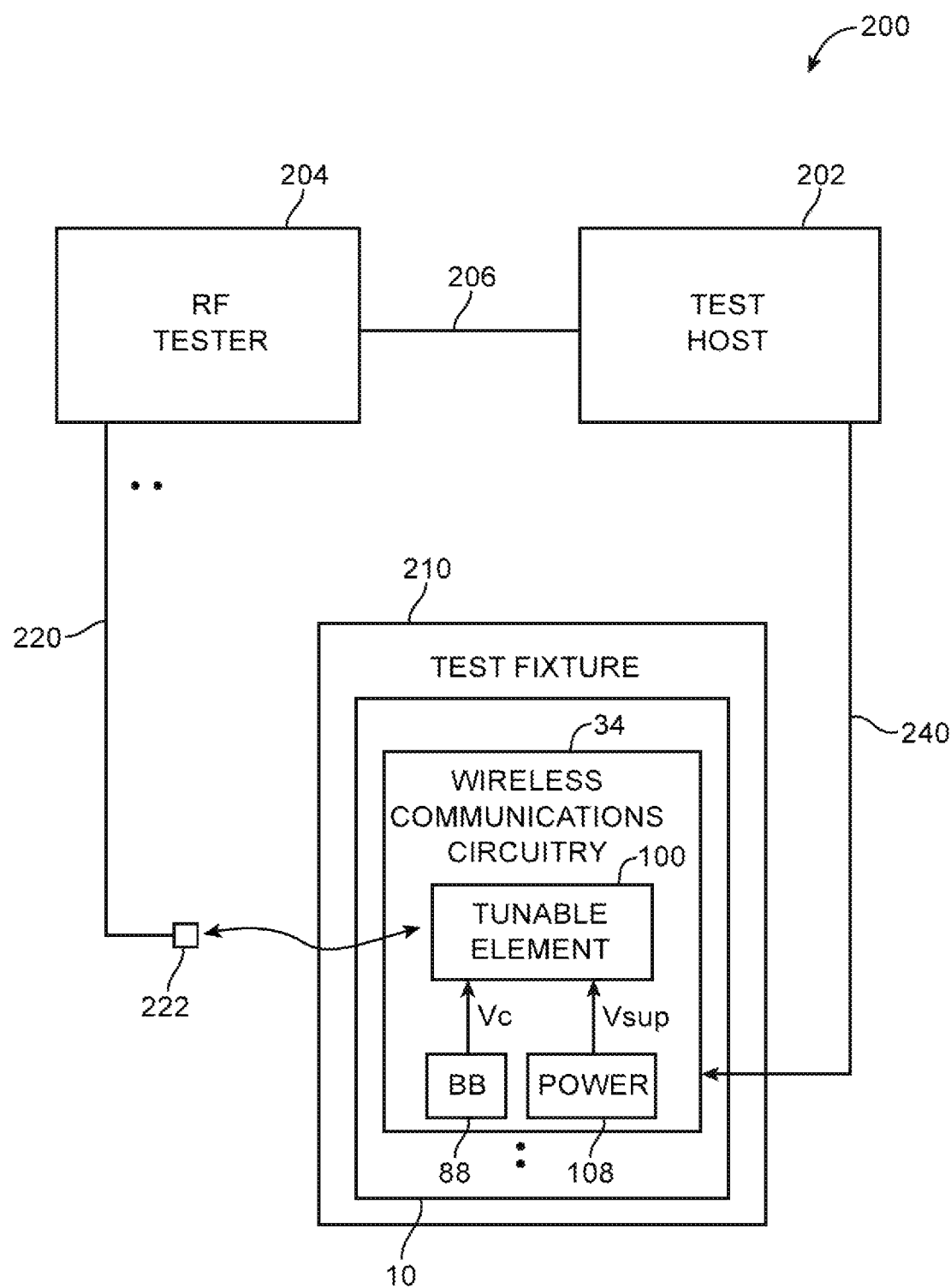

In another suitable arrangement, test host 202 may provide commands to DUT 10 during passive radio-frequency testing (see, e.g., FIG. 8). As shown in FIG. 8, test host 202 may provide test commands to DUT 10 via path 240. The connection represented by line 240 may be a Universal Serial Bus (USB) based connection, a Universal Asynchronous Receiver/Transmitter (UART) based connection, or other suitable types of data connection.

In the arrangement of FIG. 8, DUT 10 may be placed in a test mode in which baseband processor 88 and power supply unit 108 are active while transceiver circuitry 90 may still be inactive. Commands received from test host 202 via connection 240 may be processed using storage and processing circuitry 28. In response to DUT 10 receiving the commands from test host 202, power supply 108 may be configured to provide suitable power supply voltage signals Vsup to antenna tuning element 100 while baseband processor 88 may be configured to provide appropriate control signals Vc to antenna tuning element 100 so that antenna tuning element 100 can be placed in a desired tuning state for testing. The configuration of FIG. 7 in which test host 202 directly accesses and controls tunable element 100 by bypassing baseband processor 88 and the configuration of FIG. 8 in which test host 202 provides commands to DUT 10 that direct circuitry on DUT 10 (e.g., baseband processor 88, power supply circuit 108, storage and processor circuitry 28, etc.) to provide desired control signals to tunable elements 100 are merely illustrative. If desired, other suitable ways of providing power and control signals to antenna tuning element(s) 100 on DUT 10 can be implemented.

Figure 9:
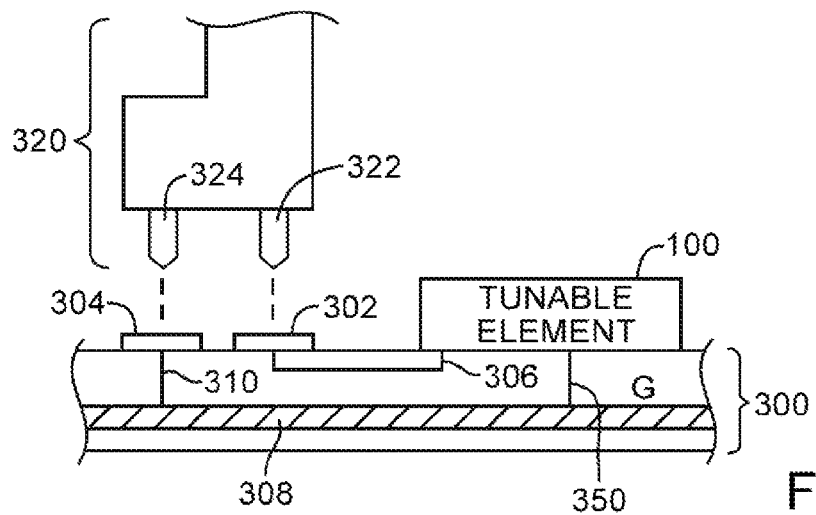
FIG. 9 is a cross-sectional side view showing how a conducted test probe having signal and ground pins may be coupled to an antenna tuning element in accordance with an embodiment of the present invention.

In some arrangements, antenna tuning element 100 may be mounted on a substrate such as semiconductor substrate 300 (see, e.g., FIG. 9). Substrate 300 may be a rigid printed circuit board, a flexible printed circuit board (e.g., a flex circuit), a rigid-flex circuit, or other suitable types of dielectric material. As shown in FIG. 9, antenna tuning element 100 may be coupled to a signal contact pad 302 and a ground contact pad 304 that are formed on the surface of substrate 300. Signal contact pad 302 may be coupled to at least one of terminals A and B of antenna tuning element 100 via conductive trace 306, whereas ground contact pad 304 may be coupled to a ground plane 308 within substrate 300 though conductive via or trace 310. Antenna tuning element 100 may be coupled to ground plane 308 through a conductive trace 350. The configuration of FIG. 9 is merely illustrative. If desired, contact pads 302 and 304 may be coupled to respective terminals of tunable element 100. In yet other suitable configurations, tunable element 100 may be mounted on plastic device housing structures, conductive device housing structures, and/or other types of device structures.

In the example of FIG. 9, a contact test probe 320 may be placed in physical contact with conductive pads 302 and 304 during test operations (e.g., to perform conducted radio-frequency testing). Test probe 320 may be one type of test probe component 222 that is coupled to RF tester 204 via cable 220 and that is used for testing antenna tuning element(s) 100 (see, FIG. 8). Test probe 320 may include first and second probe pins 322 and 324 configured to make contact with pads 302 and 304, respectively, or with other circuitry associated with antenna tuning element 100. Pins 322 and 324 may serve as signal and ground pins, respectively. At least one of pins 322 and 324 may be spring-loaded to reduce the chance of damaging the test equipment and any of the device structures under test. Test probe 320 of this type may sometimes be referred to as a pogo-pin test probe. If desired, test probes such as alligator clip probes, tweezer probes, shielded-lead probes, or other types of test probes may be used in test system 200.

Figure 10:
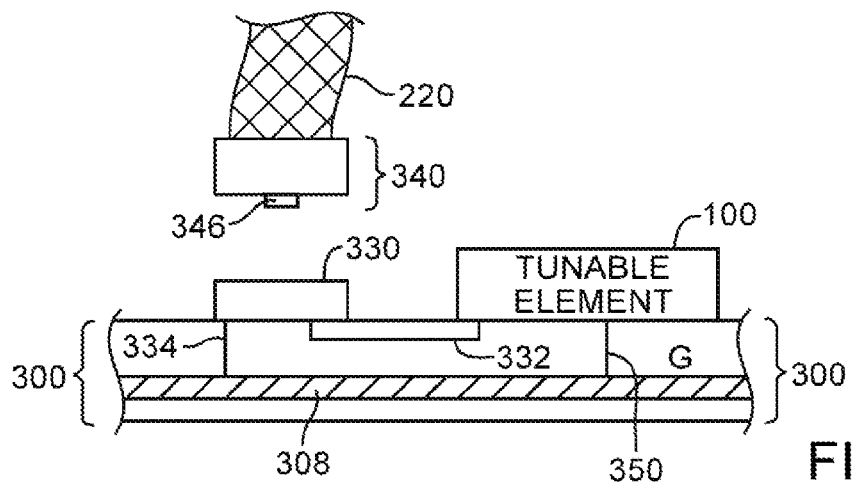
FIG. 10 is a cross-sectional side view showing how a coaxial test probe may be coupled to an antenna tuning element in accordance with an embodiment of the present invention.

FIG. 10 shows another suitable configuration in which antenna tuning element 100 is coupled to a radio-frequency connector such as coaxial radio-frequency connector 330. Connector 330 may have a signal terminal that is coupled to antenna tuning element 100 via trace 332 and a ground terminal that is coupled to ground plane 308 through via 334.

In the example of FIG. 10, a test probe such as coaxial test probe 340 may be mated with connector 330 during test operations to perform conducted RF testing. Test probe 340 may include an inner signal conductor 346 surrounded by a cylindrical shielding ground conductor. Test probe 340 may be another type of conducted test probe component 222 that is coupled to RF tester 204 via cable 220 and that is used for testing antenna tuning element(s) 100 (see, FIG. 8). Signal conductor 346 and the associated ground conductor may share a common geometric axis and may be respectively coupled to the signal and ground terminals of connector 330 when probe 340 is mated with connector 330. Test probe 340 may be a type of test probe suitable for mating with a corresponding U.FL connector, W.FL connector, SubMiniature version A (SMA) connector, SubMiniature version B (SMB) connector, or other types of coaxial radio-frequency connectors (as examples).

Figure 11:
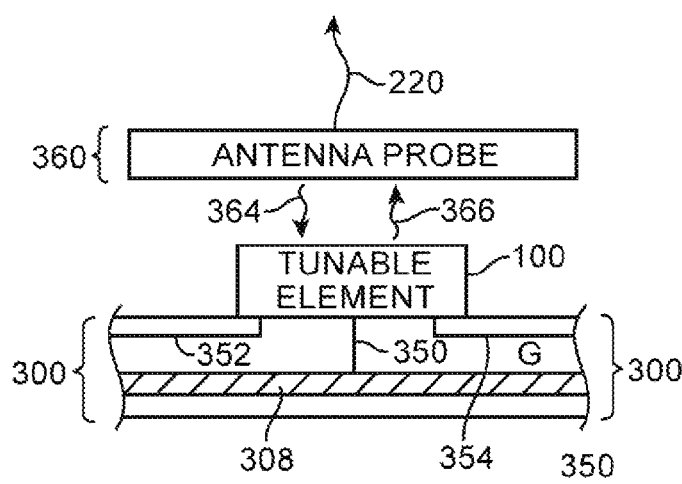
FIG. 11 is a cross-sectional side view showing how a wireless test probe may be used in testing an antenna tuning element in accordance with an embodiment of the present invention.

FIG. 11 shows another suitable configuration in which a non-contact test probe such as antenna probe 360 is used to test antenna tuning element 100 (e.g., antenna tuning element 100 may be coupled to other wireless circuitry via traces 352 and 354). Antenna probe 360, which may sometimes be referred to as a wireless probe, may include one or more antennas. Antenna probe 360 may be used to transmit radio-frequency signals 364 to the device structures under test and may be used to receive corresponding radio-frequency signals 366 from the device structures under test. The antennas in antenna probe 360, which are sometimes referred to herein as test antennas or probe antennas, may be implemented using any suitable antenna type (e.g., loop antennas, patch antennas, dipole antennas, monopole antennas, inverted-F antennas, planar inverted-F antennas, coil antennas, open-ended waveguides, horn antennas, etc.).

During testing, antenna probe 360 may be placed in the vicinity of antenna tuning element 100 or associated device structures under test. For example, antenna probe 360 may be placed within 10 cm or less of tunable element 100, within 2 cm or less of tunable element 100, or within 1 cm or less of tunable element 100 (as examples). These distances may be sufficiently small to place antenna probe 360 within the "near field" of antenna tuning element 100 (i.e., a location at which signals are received by an antenna that is located within about one or two wavelengths from element 100 or less).

The different test probes that are described in connection with FIGS. 9-11 are merely illustrative and do not serve to limit the scope of the present invention. In general, any type of conducted and/or wireless test probe can be used to transmit RF test signals to and receive RF test signals from device structures under test within a partially assembled or a completed device 10.

Figure 12:
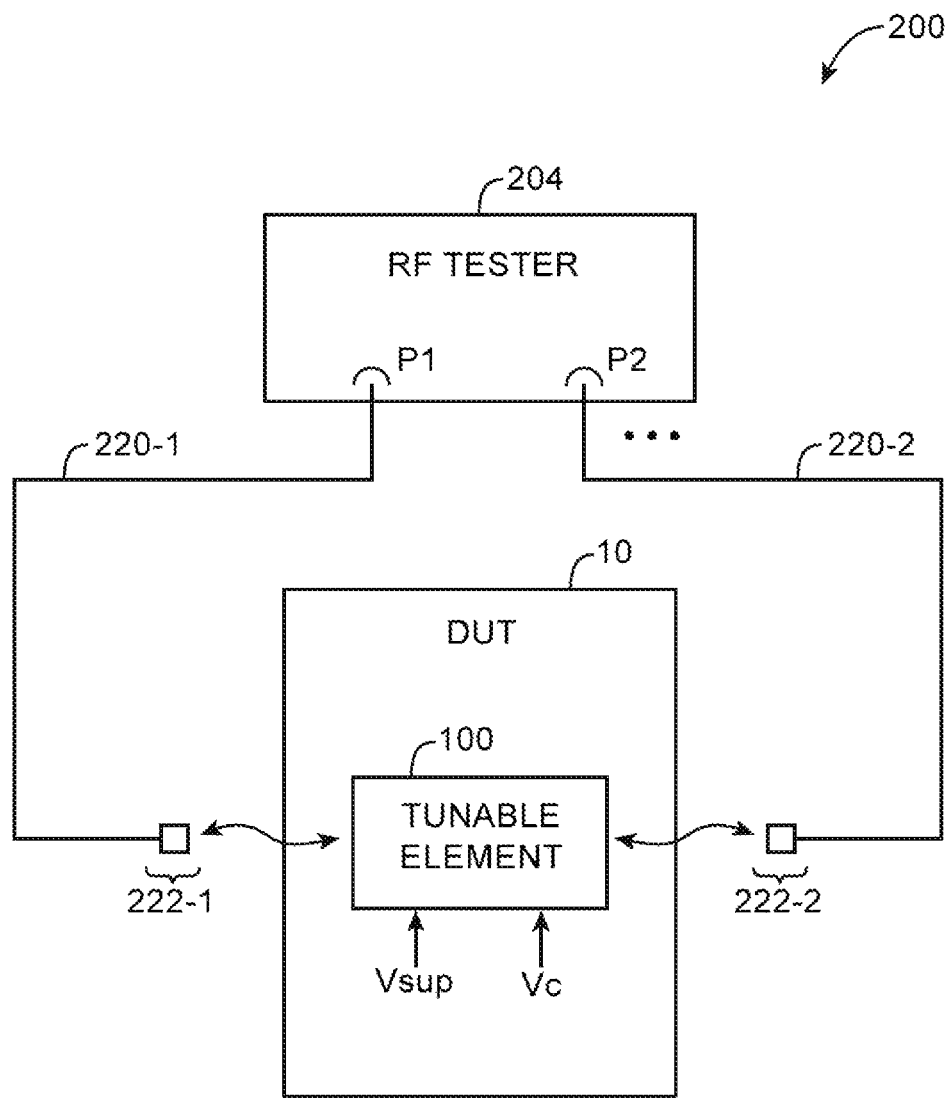
FIG. 12 is a diagram of an illustrative radio-frequency test system that can be used to gather multiport scattering parameter measurements from an antenna tuning element in accordance with an embodiment of the present invention.

FIG. 12 shows another suitable embodiment of the present invention in which tester 204 sends and receives radio-frequency test signals via more than one test port. As shown in FIG. 12, RF tester 204 may have a first test port P1 that is coupled to a first test probe 222-1 via a first RF cable 220-1 and a second test port P2 that is coupled to a second test probe 222-2 via a second RF cable 220-2. Test probes 222-1 and 222-2 may be test probes of the type described in connection with FIGS. 9-11 or other types of radio-frequency test probes.

As electromagnetic test signals are transmitted by tester 204 and applied to antenna tuning element 100 through test probe 222-1, corresponding emitted electromagnetic test signals may be received using test probe 222-2 (as an example). Tester 204 may also receive reflected signals via probe 222-1 (i.e., signals that were reflected from tunable element 100 in response to the signals transmitted through test cable 220-1).

The reflected signals gathered in this way may be used to compute a reflection coefficient (sometimes referred to as an S11 parameter or S11 scattering parameter). The transmitted signals on cable 220-1 and corresponding received signals on cable 220-2 may be used to compute a forward transfer coefficient (sometimes referred to as an S21 parameter or S21 scattering parameter). The S11 and S21 data may include magnitude and phase components.

Similarly, tester 204 may also transmit test signals to element 100 via test probe 222-2. As test electromagnetic signals are transmitted by tester 204 and applied to DUT 100 using test probe 222-2, corresponding emitted electromagnetic test signals may be received using test probe 222-1. Tester 204 may also receive reflected signals via probe 222-2 (i.e., signals that were reflected from element 100 in response to the signals transmitted through test cable 220-2). The emitted and reflected signals gathered in this way may be used to compute reflection coefficient data (sometimes referred to as an S22 scattering parameter) and forward transfer coefficient data (sometimes referred to as an S12 scattering parameter).

The S11, S12, S21, and S22 parameters (collectively referred to as scattering parameters or S-parameters) measured using tester 204 may be used as test data representative of radio-frequency characteristics associated with antenna tuning element 100. For example, in situations in which antenna tuning element 100 is operating in a desired state and exhibits desired loading, S-parameter measurements will have values that are relatively close to baseline measurements on fault-free structures (sometimes referred to as reference structures in a "gold" reference unit). In situations in which antenna tuning element 100 has a defect that affects the electromagnetic properties of the device structures under test (i.e., when an antenna tuning element is unable to switch states or when an antenna tuning element exhibits improper loading), the S-parameter measurements will exceed normal tolerances.

When tester 204 determines that the gathered test data has deviated from normal baseline measurements by more than predetermined limits, tester 204 can alert an operator that antenna tuning element 100 within device 10 and other associated wireless circuitry likely contain a defect and/or other appropriate action can be taken. If desired, test system 200 may include any number of RF testers 204 each of which includes at least one active test port (for measuring reflection coefficient data), at least two active test ports (for measuring two-port scattering parameter data), at least three active test ports (for measuring three-port scattering parameter data), at least four active test ports (for measuring four-port scattering parameter data), etc.

Illustrative test data gathered using test system 200 of FIG. 8 is shown in FIG. 12. In FIG. 12, the magnitude of reflection coefficient S11 has been plotted as a function of test signal frequency. Curve 400 corresponds to test data gathered from an antenna tuning element 100 placed in a first state, whereas curve 402 corresponds to test data gathered from antenna tuning element 100 placed in a second state that is different than the first state.

When antenna tuning element 100 is placed in the first state, it may be desirable for the magnitude of S11 to be within predetermined lower and upper limits 404L and 404U at frequency fx. When antenna tuning element 100 is placed in the second state, it may be desirable for the magnitude of S11 to be within predetermined lower and upper limits 406L and 406U at frequency fy. These predetermined limits may be violated in scenarios in which antenna tuning element 100 is incapable of switching states, in which antenna tuning element 100 presents incorrect impedance/loading, and/or in which antenna tuning element 100 exhibits other types of defect.

The predetermined limits may be determined via calibration operations. Initially, during calibration operations, test unit 204 may, for example, gather S11 measurements from antenna tuning element 100 and device structures under test that are known to be free of defects. Data gathered from fault-free devices may therefore represent a baseline (calibration) response to which other measured test data may be compared (e.g., the baseline response serves as a reference that can be used to determine when measurements results are meeting expectations or are deviating from expectations). The upper and lower limits may, for example, represent upper and lower bounds that deviate from the baseline response by a predetermined statistical variance.

Figure 13:
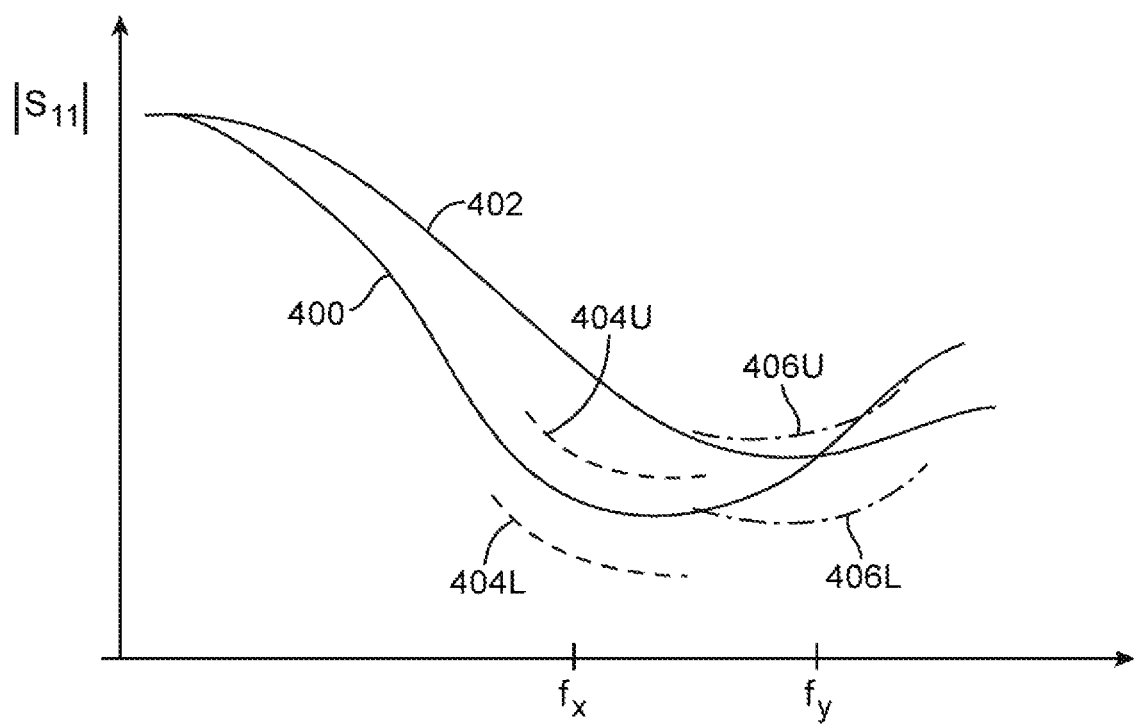
FIG. 13 is a graph in which reflection coefficient magnitude data that has been gathered using a test system of the type shown in FIG. 7 or FIG. 8 has been plotted as a function of applied signal frequency in accordance with an embodiment of the present invention.

The test data of FIG. 13 is merely illustrative. In general, magnitude and phase data may be gathered from one or more test ports to provide single-port S-parameter measurements, two-port S-parameter measurements, three-port S-parameter measurements, or other suitable measurement data to help determine whether antenna tuning element 100 and other associated wireless circuitry are capable of operating correct at desired frequencies.

Figure 14:
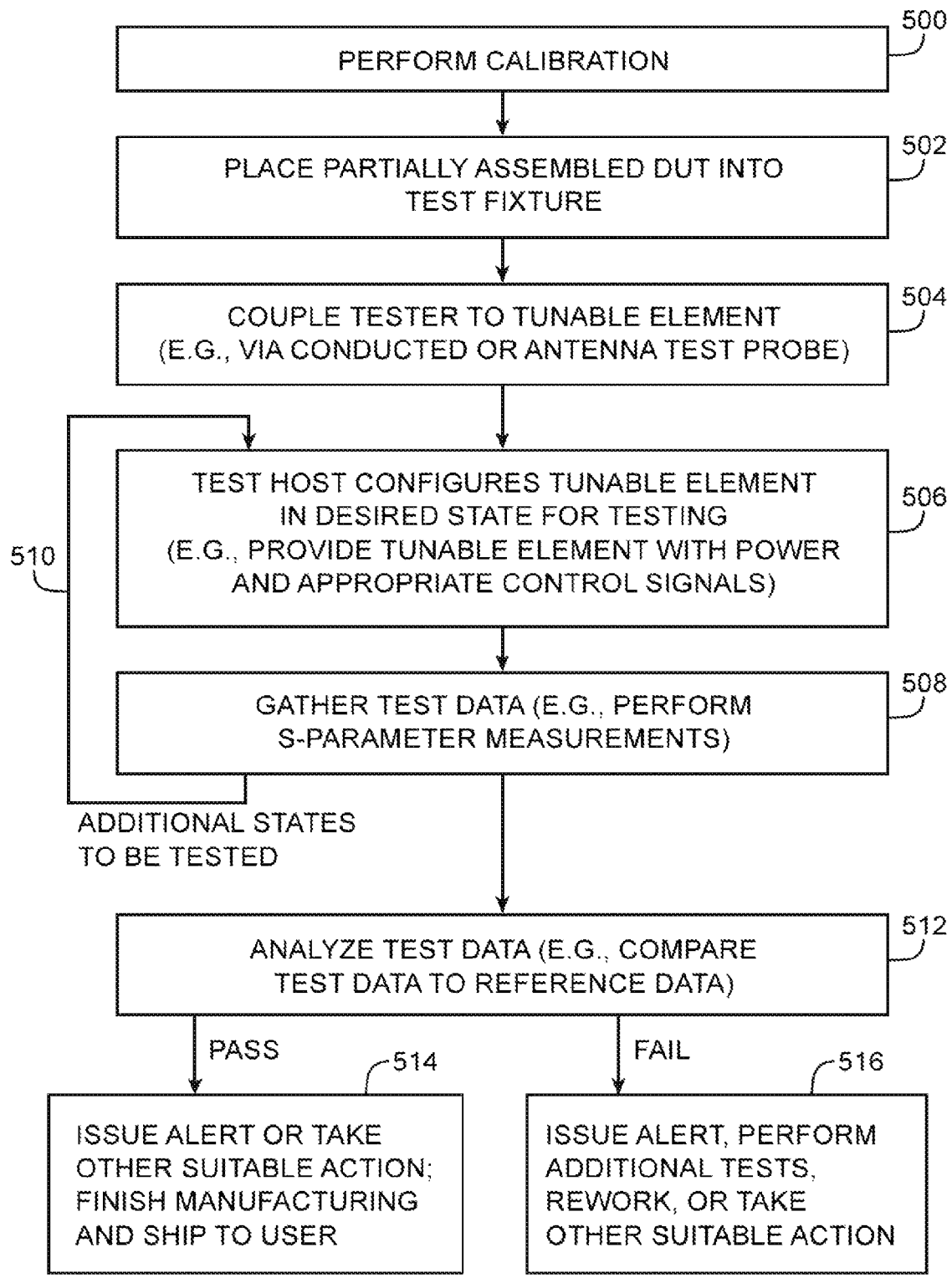
FIG. 14 is a flow chart of illustrative steps involved in testing antenna tuning element(s) in a partially assembled electronic device using a radio-frequency test system in accordance with an embodiment of the present invention.

Illustrative steps involved in performing radio-frequency testing on devices 10 with antenna tuning elements 100 using test system 200 are shown in FIG. 14.

At step 500, calibration operations may be performed on reference devices 10 with antenna tuning element(s) that are free of defects. The reference devices that are being tested during calibration should be in a similar form as that of devices being tested by system 200 during production testing (e.g., if test system 200 tests devices 10 in the partially assembled state, calibration data should be gathered from similar partially assembled reference devices).

During calibration, tester 204 may use a test probe to transmit and receive radio-frequency signals in a desired frequency range (e.g., from 0 Hz to 3 GHz, from 3-14 GHz, a subset of one of these frequency ranges, or another suitable frequency range). Signals corresponding to the transmitted signals may be received from the device structures under test and processed with the transmitted signals to obtain scattering parameter measurements or other suitable test data. The S-parameter measurements or other test measurements that are made on the properly manufactured device structures may be stored in storage in tester 204 (e.g., in storage on a vector network analyzer, in storage on computing equipment such as a computer or network of computers that are associated with the vector network analyzer, etc.). If desired, antenna tuning elements 100 that are tested during the calibration operations of step 500 may be "limit samples" (i.e., components that have parameters on the edge or limit of the characteristic being tested). Device structures of this type are marginally acceptable and can therefore be used in establishing limits (e.g., upper and lower bound limits) on acceptable device performance during calibration operations.

At step 502, a partially assembled production DUT 10 may be placed within test fixture 210. At step 504, tester 204 may be electrically coupled to antenna tuning element 100 via one or more conducted and/or wireless test probes.

At step 506, test host 202 may be used to place selected antenna tuning element 100 within DUT 10 in a desired state for testing. As an example, test host 202 may directly send power and control signals to antenna tuning element 100 (FIG. 7). As another example, test host 202 may send test commands to storage and processing circuitry 28 of device 10 that direct the storage and processing circuitry of device 10 to send appropriate power and control signals to antenna tuning element 100 (FIG. 8).

At step 508, tester 204 may use one or more test probes 222 to gather test data. During the operations of step 508, tester 204 may use test probe(s) 222 to transmit and receive radio-frequency signals in a desired frequency range (e.g., from 0 Hz to 3 GHz, 3 GHz to 14 GHz, or other suitable frequency range, preferably matching the frequency range used in obtaining the calibration measurements of step 500). Wireless test data such as S11, S21, S12, and S22 measurements or other suitable test data may be gathered. The S-parameter measurements (phase and magnitude measurements for impedance and forward transfer coefficient) may be stored in storage in tester 204. Processing may loop back to step 506 to test other states of antenna tuning element 100, as indicated by path 510 (e.g., to ensure that antenna tuning element 100 is capable of switching to another state and is operable to provide the desired impedance characteristic in each of the different respective states).

When test data from a sufficient number of antenna tuning states have been gathered, the radio-frequency test data may be analyzed (at step 512). For example, the test data that was gathered during the operations of step 508 may be compared to the baseline (calibration) data obtained during the operations of step 500 (e.g., by calculating the difference between these sets of data and determining whether the calculated difference exceeds predetermined threshold amounts, by comparing test data to calibration data from limit samples that represents limits on acceptable device structure performance, or by otherwise determining whether the test data deviates by more than a desired amount from acceptable data values).

After computing the difference between the test data and the calibration data at one or more frequencies to determine whether the difference exceeds predetermined threshold values, appropriate actions may be taken. For example, if the test data and the calibration data differ by more than a predetermined amount, tester 204 may conclude that antenna tuning element 100 current being tested contains a fault and appropriate actions may be taken at step 516 (e.g., by issuing an alert, by informing an operator that additional testing is required, by displaying information instructing an operator to rework or scrap the device structures, etc.).

In response to a determination that the test data and the calibration data differ by less than the predetermined amount, tester 204 may conclude that the device structures under test (including antenna tuning element 100 currently being tested) have been manufactured properly and appropriate actions may be taken at step 514 (e.g., by issuing an alert that the structures have passed testing, by completing the assembly of the structures to form a finished electronic device, by shipping the final assembled electronic device to a customer, etc.).

The foregoing is merely illustrative of the principles of this invention and various modifications can be made by those skilled in the art without departing from the scope and spirit of the invention. The foregoing embodiments may be implemented individually or in any combination.

What is claimed is:

1. A method for using a radio-frequency test system to test an electronic device under test that contains transceiver circuitry and a tunable antenna having an adjustable antenna tuning element, the method comprising:
   placing the adjustable antenna tuning element in a plurality of tuning states to tune the tunable antenna;
   while the adjustable antenna tuning element is being placed in each of the plurality of states and while the transceiver circuitry is deactivated, gathering test data from the electronic device under test with the radio-frequency test system; and
   with the radio-frequency test system, gathering baseline test data by performing radio-frequency calibration on a plurality of reference electronic devices under test, wherein the adjustable antenna tuning element comprises at least one adjustable circuit selected from the group consisting of: a radio-frequency switch, a tunable resistive component, a tunable capacitive component, and a tunable inductive component.

2. The method defined in claim 1, further comprising:
   with the radio-frequency test system, comparing the test data to the baseline radio-frequency test data to determine whether the tunable antenna satisfies design criteria.

3. The method defined in claim 1, wherein gathering the test data and the baseline test data comprises obtaining multiport scattering parameter measurements.

4. The method defined in claim 1, wherein placing the adjustable antenna tuning element in the plurality of tuning states comprises controlling the adjustable antenna tuning element using the radio-frequency test system.

5. The method defined in claim 1, wherein placing the adjustable antenna tuning element in the plurality of tuning states comprises configuring the adjustable antenna tuning element to exhibit different impedance values in the respective tuning states.

6. The method defined in claim 1, wherein the radio-frequency test system comprises a radio-frequency tester, and wherein gathering the test data from the electronic device under test comprises:
   sending radio-frequency test signals to the electronic device under test with the radio-frequency tester; and
   receiving corresponding radio-frequency test signals from the electronic device under test with the radio-frequency tester.

7. The method defined in claim 6, wherein gathering the test data from the electronic device under test comprises gathering scattering parameter measurements.

8. The method defined in claim 1, wherein the electronic device under test comprises a partially assembled wireless electronic device.

9. The method defined in claim 8, wherein gathering test data from the electronic device under test with the radio-frequency test system comprises gathering scattering parameter measurements from the electronic device under test while the transceiver circuitry in the electronic device under test is idle.

10. The method defined in claim 9, wherein gathering the scattering parameter measurements comprises coupling the adjustable antenna tuning element to the radio-frequency test system using a contact test probe.

11. The method defined in claim 9, wherein gathering the scattering parameter measurements comprises coupling the adjustable antenna tuning element to the radio-frequency test system using a wireless test probe.

* * * * *